(12) United States Patent
Matsuo et al.

(10) Patent No.: US 8,471,319 B2
(45) Date of Patent: Jun. 25, 2013

(54) SEMICONDUCTOR DEVICE HAVING MULTILAYERED INTERELECTRODE INSULATING FILM

(75) Inventors: Kazuhiro Matsuo, Mie (JP); Masayuki Tanaka, Kanagawa (JP); Hirofumi Iikawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/237,486

(22) Filed: Sep. 20, 2011

(65) Prior Publication Data
US 2012/0126299 A1 May 24, 2012

(30) Foreign Application Priority Data
Nov. 24, 2010 (JP) .................. 2010-261128

(51) Int. Cl.
*H01L 29/792* (2006.01)
*H01L 21/28* (2006.01)

(52) U.S. Cl.
USPC ...... 257/296; 257/E21.21; 257/315; 257/324; 438/591

(58) Field of Classification Search
USPC ............. 257/296, 324, 315, E21.21; 438/591
See application file for complete search history.

(56) References Cited

U.S. PATENT DOCUMENTS

| | | | | |
|---|---|---|---|---|
| 7,612,404 B2 * | 11/2009 | Yamamoto et al. | ............ | 257/321 |
| 2007/0262372 A1 * | 11/2007 | Yamamoto et al. | ............ | 257/324 |
| 2008/0277716 A1 | 11/2008 | Nishida et al. | | |
| 2009/0011586 A1 * | 1/2009 | Akahori et al. | ............... | 438/591 |
| 2009/0134446 A1 | 5/2009 | Sekine et al. | | |
| 2010/0102377 A1 | 4/2010 | Iikawa et al. | | |
| 2010/0155805 A1 | 6/2010 | Ozawa | | |
| 2010/0308393 A1 | 12/2010 | Matsuo et al. | | |

FOREIGN PATENT DOCUMENTS

| | | |
|---|---|---|
| JP | 2009-130120 A | 6/2009 |
| JP | 2010-103414 | 5/2010 |
| JP | 2010-147241 A | 7/2010 |
| KR | 10-2004-0065031 | 7/2004 |

OTHER PUBLICATIONS

Office Action issued Nov. 29, 2012 in Korean Patent Application No. 10-2011-92462 English language translation only.
U.S. Appl. No. 13/423,664, filed Mar. 19, 2012, Nakahara, et al.
U.S. Appl. No. 13/423,633, filed Mar. 19, 2012, Matsuo, et al.

* cited by examiner

*Primary Examiner* — Thao Le
*Assistant Examiner* — Brian B Lee
(74) *Attorney, Agent, or Firm* — Oblon, Spivak, McClelland, Maier & Neustadt, L.L.P.

(57) ABSTRACT

A semiconductor device is disclosed. The semiconductor device includes a semiconductor substrate; a gate insulating film formed above the semiconductor substrate; a charge storage layer formed above the gate insulating film; a multi-layered interelectrode insulating film formed in a first region above an upper surface portion of the element isolation insulating film, a second region above a sidewall portion of the charge storage layer and a third region above an upper surface portion of the charge storage layer, the interelectrode insulating film including a stack of an upper silicon oxide film, a middle silicon nitride film, and a lower silicon oxide film; a control gate electrode formed above the interelectrode insulating film; wherein the middle silicon nitride film is thinner in the third region than in the second region and the upper silicon oxide film is thicker in the third region than in the second region.

14 Claims, 15 Drawing Sheets

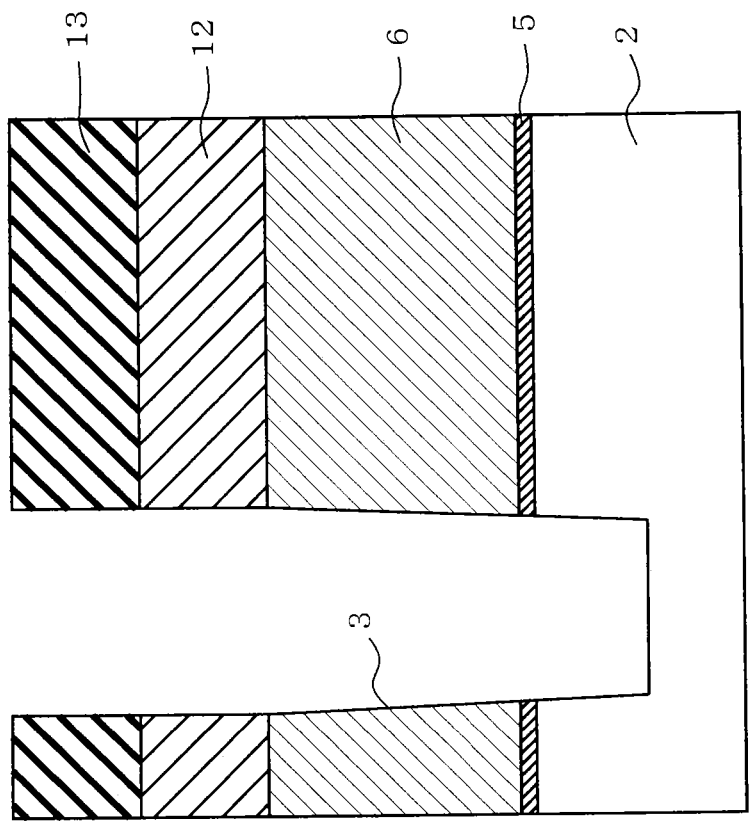
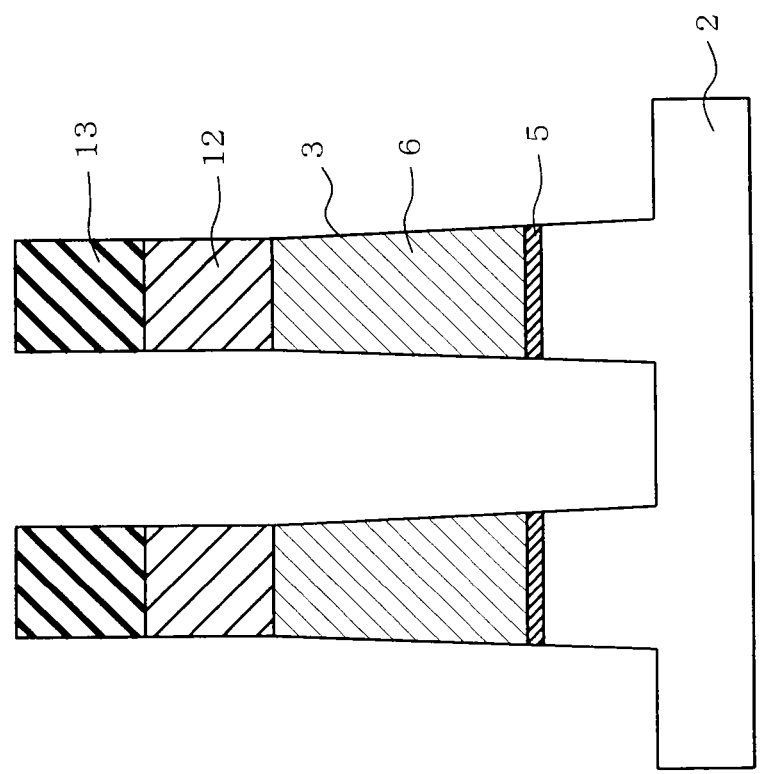

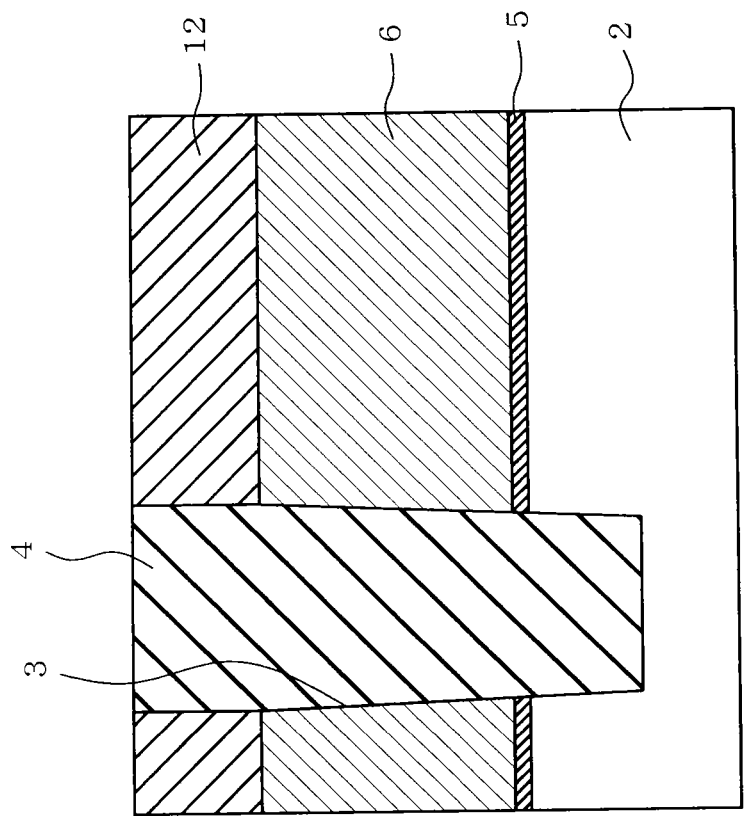
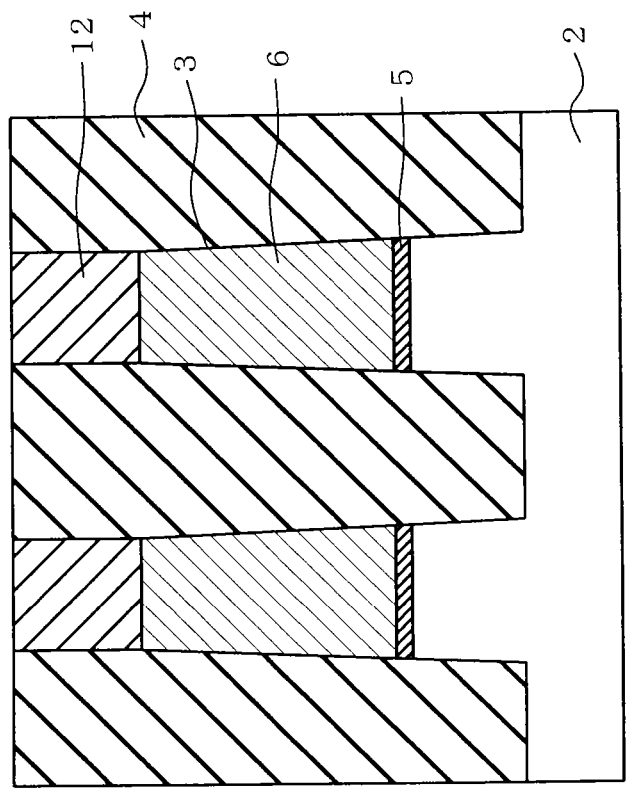
FIG. 11A
FIG. 11B

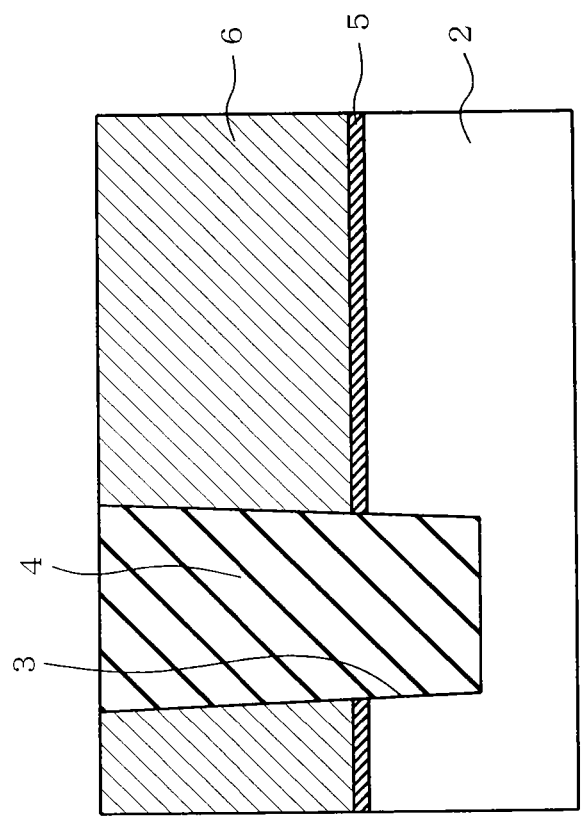
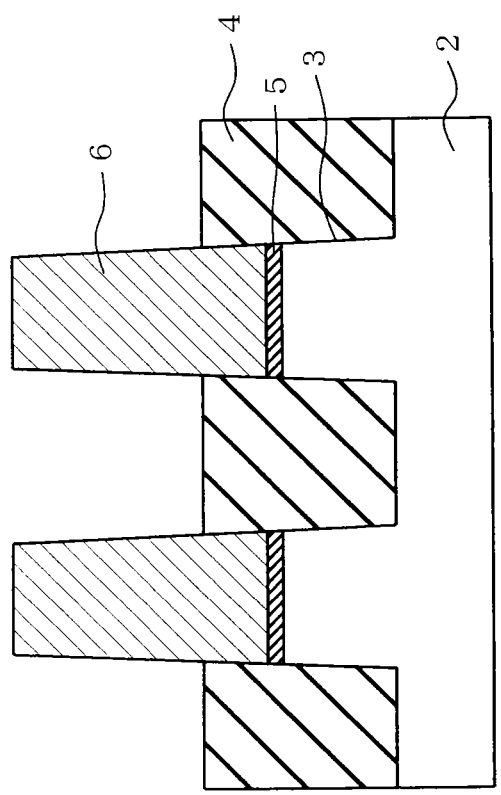
FIG. 12B
FIG. 12A

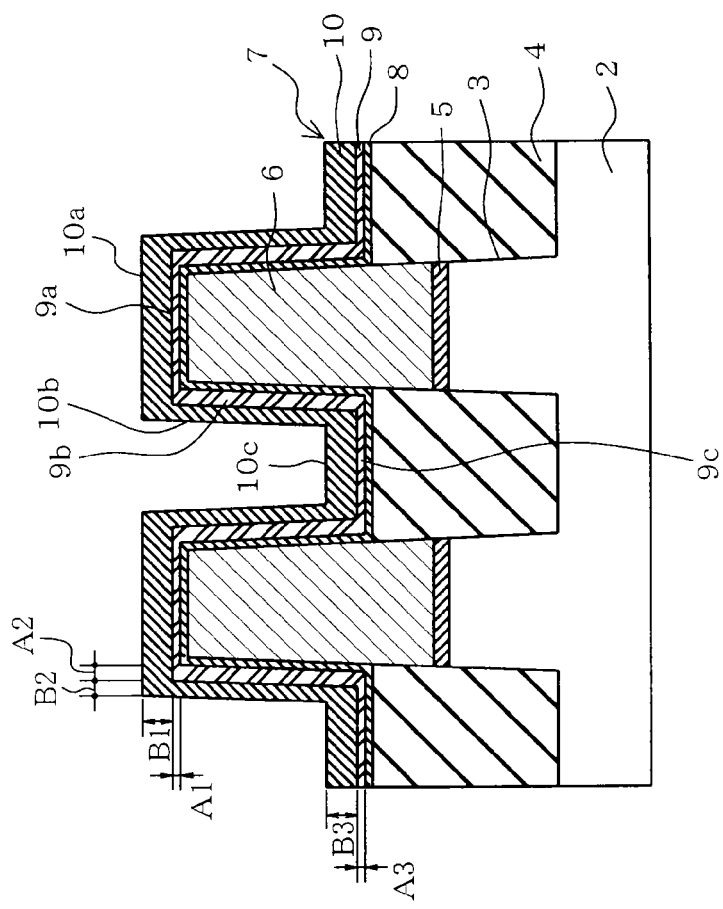
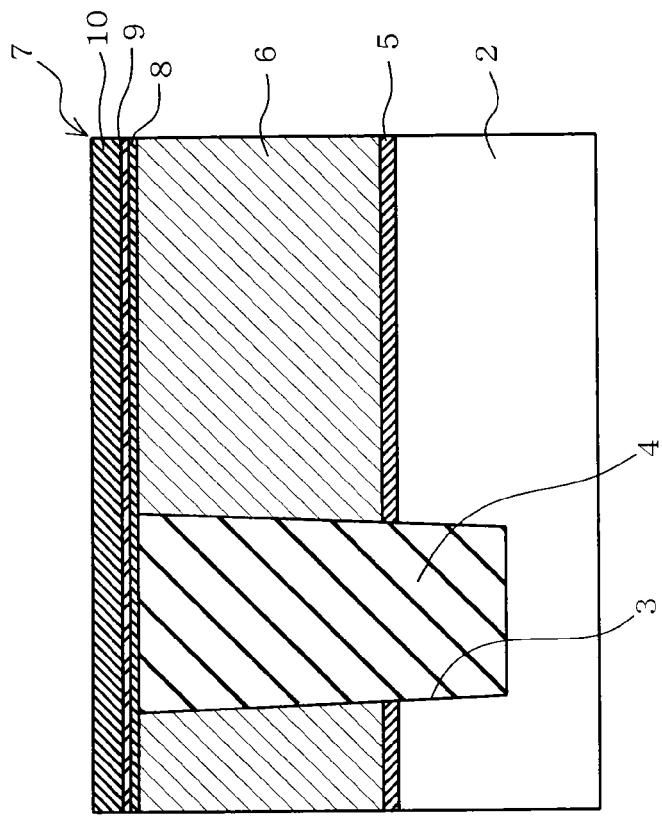
FIG. 14A
FIG. 14B

SEMICONDUCTOR DEVICE HAVING MULTILAYERED INTERELECTRODE INSULATING FILM

CROSS-REFERENCE TO RELATED APPLICATION(S)

This application is based upon and claims the benefit of priority from Japanese Patent Application No. 2010-261128, filed on, Nov. 24, 2010 the entire contents of which are incorporated herein by reference.

FIELD

Embodiments disclosed herein generally relate to a semiconductor device provided with a memory cell configured by a stacked-gate structure in which an interelectrode insulating film is interposed between a stack of floating gate electrode and a control gate electrode. The embodiments also relate to a method of manufacturing such semiconductor device.

BACKGROUND

A flash memory is typically configured by an array of multiplicity of memory cells aligned in the word line direction and the bit line direction. A memory cell is configured by a stacked gate structure in which a floating gate electrode, interelectrode insulating film, and control gate electrode are stacked in the listed sequence. As flash memory increases its storage capacity through densification, features within the memory cell are packed in tighter dimensions. Dimensions typically affected by the densification are widths of floating gate electrodes and element isolation trenches. For instance, narrowing of the element isolation trenches makes formation of control gate electrode difficult since polysilicon film, typically employed as a control gate electrode material, needs to be filled in the narrowed gaps between the neighboring floating gate electrodes which are further narrowed by the presence of the interelectrode insulating film. One solution to this problem may be thinning the interelectrode insulating film. However, as the memory cells become smaller, relatively higher electric field is applied to the floating gate electrode through the interelectrode insulating film during programming. This is because downscaling of a memory cell often results in a floating gate electrode with a sharp tip. Because electric field tends to concentrate at the tips, edges, and corners, the downscaled floating gate having relatively larger percentage of such high electric field regions are subjected to larger amount of high electric field leakage current which prevents the memory cell from being programmed to the desired threshold.

The interelectrode insulating film is often configured by an ONO structure in which a silicon nitride film is interposed between the top silicon oxide film and the bottom silicon oxide film. The problem encountered in such ONO structure is electron traps within the silicon nitride film, which typically occurs in the aforementioned high-field regions located at the top portion of the floating gate electrode where electric field concentration occurs. The trapped electrons, when detrapped, degrades the charge retainability of the interelectrode insulating film.

It is further known that thinner interelectrode insulating film results in shorter endurance, in other words, reduced voltage tolerance. The interelectrode insulating film is not only used in the gate structures in the memory cell region but also in the elements for driving device operation provided in the peripheral circuit region such as capacitors for generating voltage. In applications where the device is expected to run extensively, enhanced endurance, i.e. voltage tolerance of the interelectrode insulating film is an important factor in achieving a long running device. However, a thinner interelectrode insulating film, which is advantageous in terms of gap fill capability, degrades the endurance/voltage tolerance of the interelectrode insulating film, and thus, will subject the elements in the peripheral circuit region and consequently the entire device to greater risk of malfunctioning. It is thus, required to further improve the insulativity of the interelectrode insulating film.

BRIEF DESCRIPTION OF THE DRAWINGS

FIGS. 9A, 10A, 11A, 12A, 13A and 14A each depict a cross section taken along line 2-2 of FIG. 1 illustrating one phase of a manufacturing process flow of a memory cell region, whereas FIGS. 9B, 10B, 11B, 12B, 13B and 14B each depict a cross section illustrating one phase of a manufacturing process flow of a peripheral circuit region;

DETAILED DESCRIPTION

Figure 1:
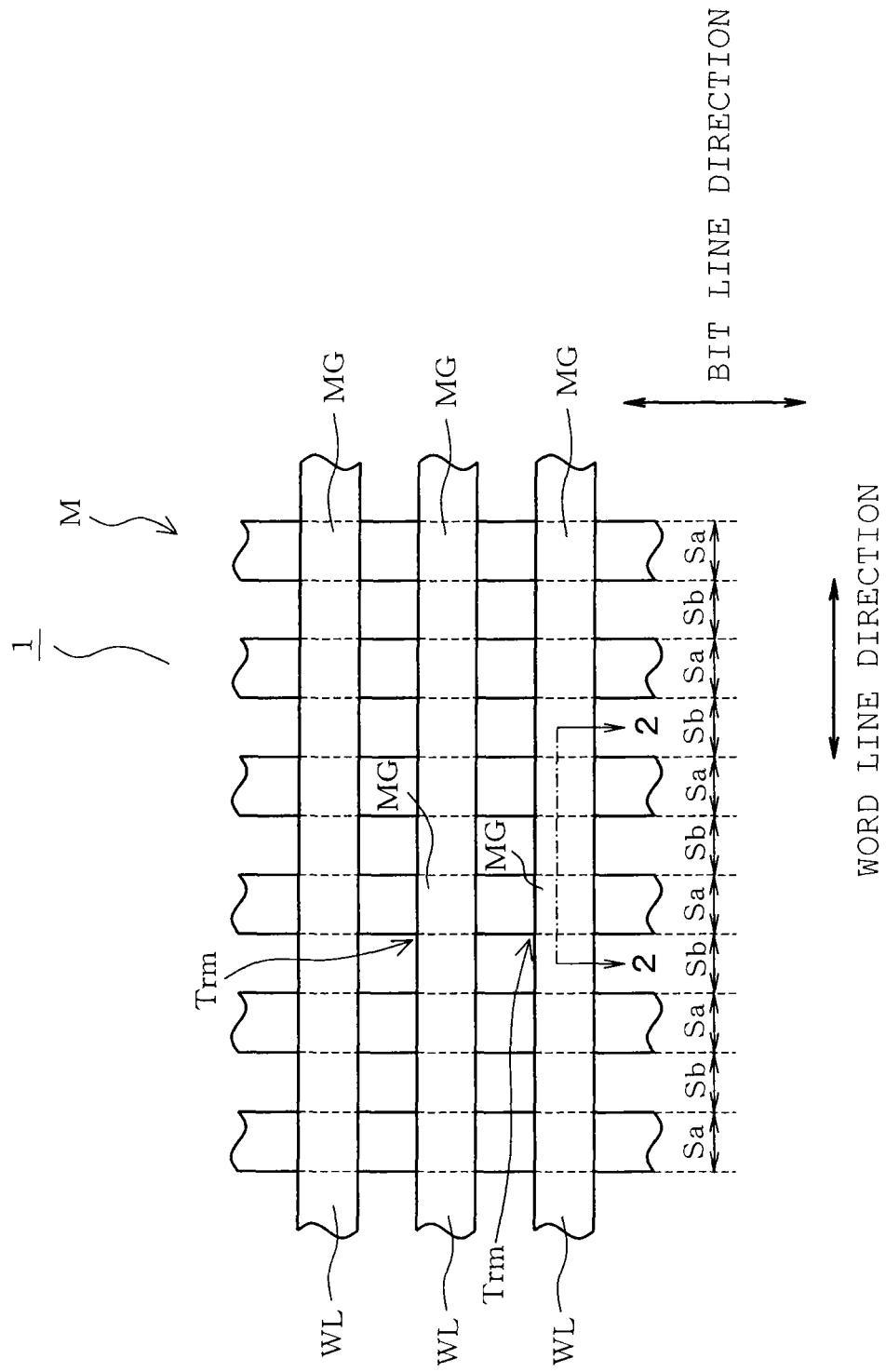
FIG. 1 schematically illustrates the planar structure of a memory cell region according to a first embodiment of the present disclosure.

In one embodiment, a semiconductor device is disclosed. The semiconductor device includes a semiconductor substrate, an element isolation region that is defined in the semiconductor substrate and that has an element isolation insulating film formed therein; an active region defined in the semiconductor substrate which is delineated by the element isolation region; a gate insulating film formed in the active region; and a charge storage layer formed above the gate insulating film. A multilayered interelectrode insulating film is formed in a first region above an upper surface portion of the element isolation insulating film, a second region above a sidewall portion of the charge storage layer, and a third region above an upper surface portion of the charge storage layer. The interelectrode insulating film includes a stack of an upper silicon oxide film, a middle silicon nitride film, and a lower silicon oxide film. A control gate electrode is formed above the interelectrode insulating film. The middle silicon nitride film is thinner in the third region than in the second region and the upper silicon oxide film is thicker in the third region than in the second region.

In one embodiment, a method of forming a semiconductor device is disclosed. The method includes forming a gate insulating film above a semiconductor substrate; forming a charge storage layer above the gate insulating film; forming an element isolation trench into the charge storage layer, the gate insulating film, and the semiconductor substrate; and filling the element isolation trench with an element isolation insulating film. The method further includes exposing an upper surface and an upper sidewall of the charge storage layer; and forming a multilayered interelectrode insulating film in a first region above an upper surface portion of the element isolation insulating film, a second region above a sidewall portion of the charge storage layer, and a third region above an upper surface portion of the charge storage layer. The interelectrode insulating film includes at least a stack of a lower silicon oxide film, a middle silicon nitride film, and an upper silicon oxide film. The forming includes oxidizing the middle silicon nitride film such that the middle silicon nitride film is thinner in the third region than in the second region, and the upper silicon oxide film above the middle silicon nitride film is thicker in the third region than in the second region. The method further includes forming a conductive layer above the interelectrode insulating film after oxidizing the middle silicon nitride film.

Embodiments of the present disclosure are described hereinafter with reference to the accompanying drawings. Elements that are identical or similar are represented by identical or similar reference symbols across the figures. The drawings are not drawn to scale and thus, do not reflect the actual measurements of the features such as the correlation of thickness to planar dimensions and the relative thickness of different layers.

FIG. 1 provides a plan view of memory cell region M of a nonvolatile semiconductor storage device 1 or simply semiconductor device 1 according to the first embodiment. As shown in FIG. 1, memory cell region M contains multiplicity of memory cell transistors Trm in a matrix alignment along the word line direction and the bit line direction. The peripheral circuit not shown reads, programs, and erases the data stored in memory cell transistors Trm. NAND flash memory is a typical example of a nonvolatile semiconductor storage device employing such memory cell structure. NAND flash memory is typically configured by an array of NAND strings or units of cells in which a plurality of memory cell transistors are series connected between a pair select transistors.

Figure 2:
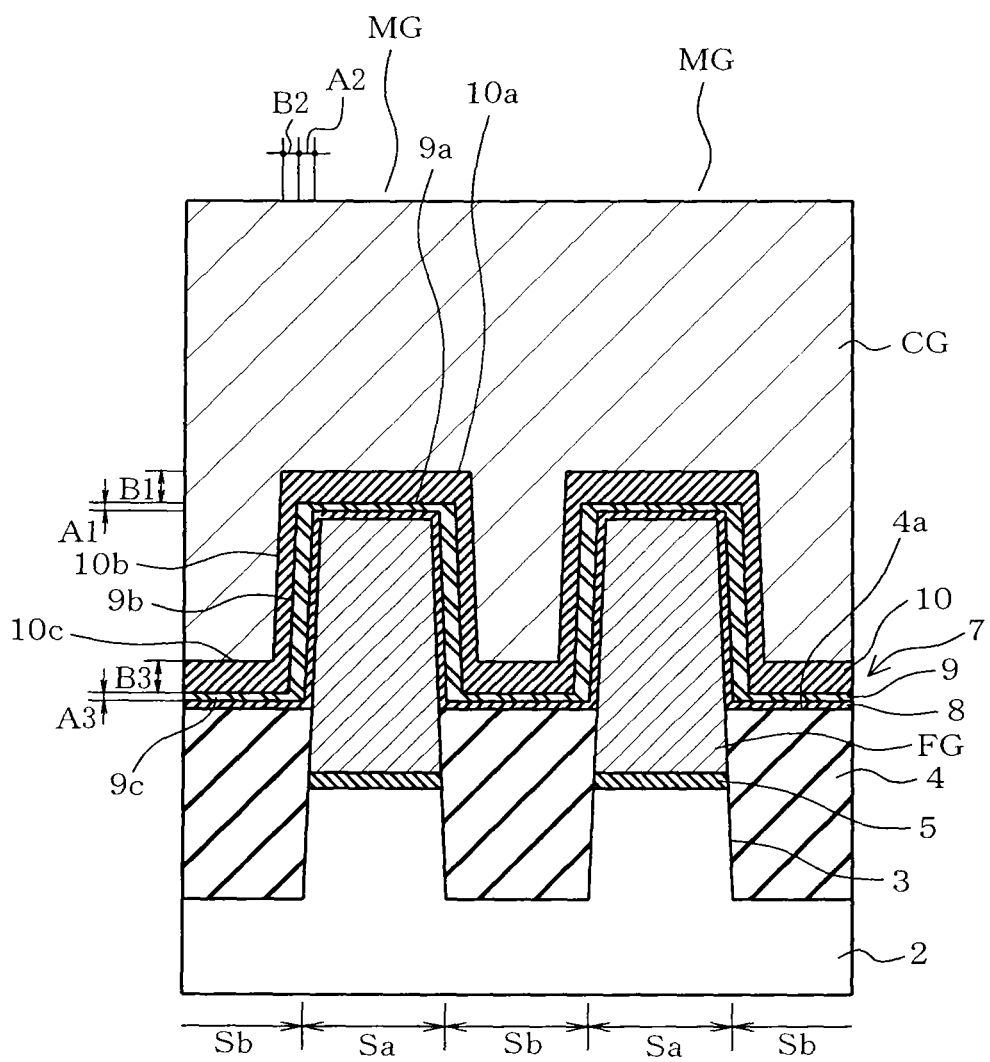
FIG. 2 is a cross sectional view taken along line 2-2 of FIG. 1.
Figure 3:
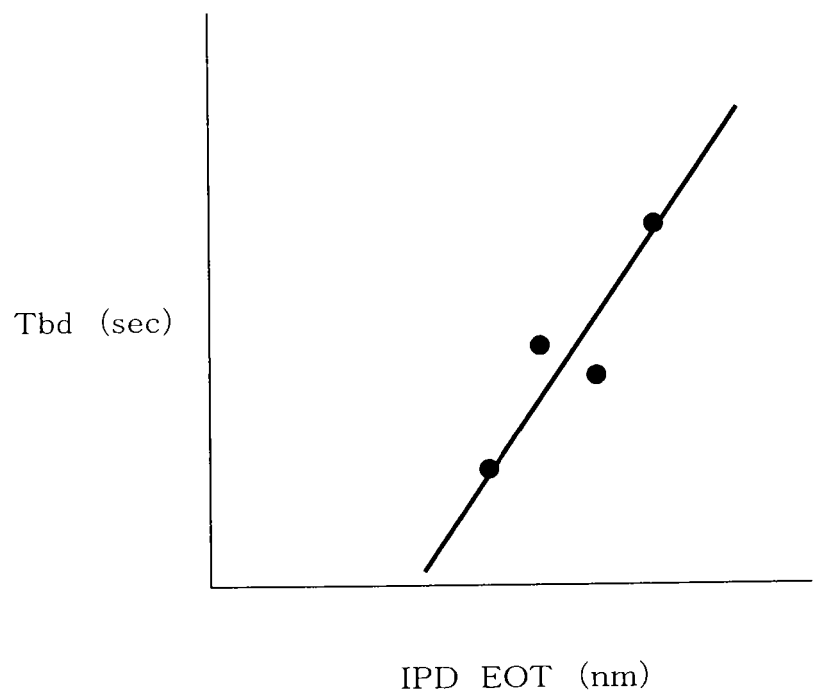
FIG. 3 is a chart plotting EOT (Equivalent Oxide Thickness) versus endurance (voltage tolerance) of an interelectrode insulating film.

FIG. 2 is a cross sectional view taken along line 2-2 of FIG. 1 which extends along the word line and the width direction of the channel of each memory cell. As can be seen in FIG. 2, semiconductor substrate exemplified as silicon substrate 2 in the first embodiment has element isolation trenches 3 formed in its surface layer. Element isolation trenches 3 isolate multiplicity of active regions Sa in the word line direction as viewed in FIG. 2.

Each element isolation trench 3 is filled with element isolation film 4 to form element isolation region Sb. Element isolation insulating film 4 typically overfills element isolation trench 3 such that the resulting structure has a lower portion that fills up trench 3 and an upper portion overflowing from trench 3 so as to protrude above the surface of active region Sa defined in silicon substrate 2. Element isolation insulating film 4 may comprise a silicon oxide film which is typically formed by SOG (Spin On Glass) materials such as polysilazane.

Active regions Sa are defined in silicon substrate 2 as the result of isolation provided by element isolation regions Sb. Each active region Sa has gate insulating film 5 also referred to as tunnel insulating film 5 formed above it. Gate insulating film 5 is typically made of silicon oxide film. Above gate insulating film 5, floating gate electrode FG is provided which serves a charge storage layer. Floating gate electrode FG is configured by a semiconductor layer serving as a conductive layer typically made of polycrystalline silicon layer 6 doped with impurities such as phosphorous. The lower side surface of polycrystalline silicon layer 6 is placed in contact with the upper side surface of element isolation insulating film 4, whereas its upper side surface protrudes above upper surface 4a of element isolation insulating film 4.

Upper surface 4a of element isolation insulating film 4, the upper sidewall and the upper surface of floating gate electrode FG are lined by interelectrode insulating film 7. Interelectrode insulating film 7 may also be referred to as interpoly insulating film 7 or interconductive layer insulating film 7. Interelectrode insulating film 7 takes a multilayered ONO structure in which a layer of bottom silicon oxide film 8, a layer of middle silicon nitride film 9, and a layer of top silicon oxide film 10 are stacked in the listed sequence above upper surface 4a of element isolation insulating film 4, the sidewall and the upper surface of floating gate electrode FG.

The thickness of silicon nitride film 9 is controlled such that its thickness varies depending on location. The thickness of section 9a located above the upper surface of floating gate electrode FG has measurement A1, whereas the thickness of section 9b located above the sidewall of floating gate electrode FG has measurement A2, where A1<A2. Further, the thickness of section 9c located above the upper surface of element isolation insulating film 4 has measurement A3, where A3≈A1<A2.

Similarly, the thickness of silicon oxide film 10 is controlled such that its thickness varies depending on location. The thickness of section 10a located above the upper surface of floating gate electrode FG has measurement B1, whereas the thickness of section 10b located above the sidewall of floating gate electrode FG has measurement B2, where B1>B2. Further, the thickness of section 10c located above the upper surface of element isolation insulating film 4 has measurement B3, where B3≈B1>B2.

The thickness of silicon oxide film 8, on the other hand, is substantially uniform throughout the entire range running from the upper surface of floating gate electrode FG, the sidewall of floating gate electrode FG, and the upper surface of element isolation insulating film 4.

Above interelectrode insulating film 7, conductive layer 11 is formed that serves globally as a word line extending across the memory cell array and locally as control gate CG for each memory cell. Conductive layer 11, for instance, includes a polycrystalline silicon layer and a silicide layer formed directly on top of the polycrystalline silicon layer. The silicide layer comprises a silicide of either of metals such as tungsten, cobalt, and nickel. Gate electrode MG of memory cell transistor Trm thus, takes a stacked gate structure in which gate insulating film 5, floating gate electrode FG, interelectrode insulating film 7, and control gate electrode CG are stacked in the listed sequence.

Gate electrodes MG of memory cell transistors Trm are electrically isolated in the bit line direction by gaps not shown. The gaps are filled with materials such as interlayer insulating film not shown. Beside gate electrode MG of each memory cell transistor Trm, a diffusion layer also referred to as a source/drain region is formed in the surface layer not shown of silicon substrate 2. Memory cell transistor Trm is composed of but not limited to gate insulating film 5, gate electrode MG, and source and drain region.

The above described nonvolatile semiconductor storage device 1 is configured to erase/program the data stored in the memory cell by applying high electric field, drawn from the peripheral circuit not shown, between word line WL and P-well of silicon substrate 2 as well as applying suitable predetermined voltage on electric elements such as the source and drain. For instance, when programming, the peripheral circuit applies high voltage on the selected word line WL while applying low voltage on P-well, etc., provided in silicon substrate 2. When erasing, the peripheral circuit applies low voltage on the selected word line WL while applying high voltage on P-well of silicon substrate 2.

Referring to FIGS. 9A to 14B, a description will be given on the process flow for manufacturing the above described nonvolatile semiconductor storage device 1. FIGS. 9A to 14A are cross sectional views of memory cell region M taken along line 2-2 of FIG. 1 at different stages of the manufacturing process flow. FIGS. 9B to 14B are cross sectional views of the peripheral circuit region taken at different stages of the manufacturing process flow.

Figure 9A:
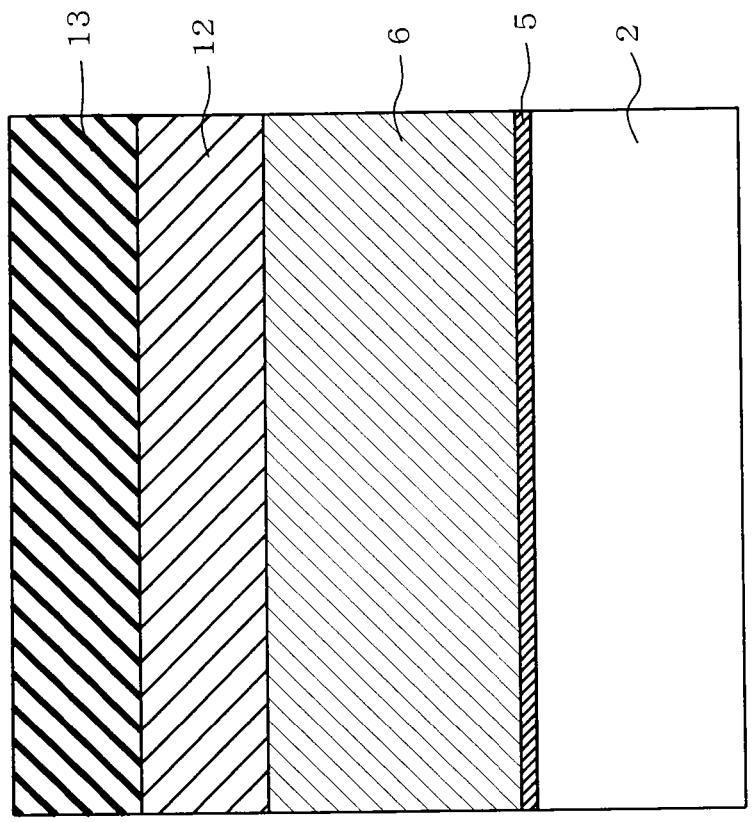
Figure 9B:
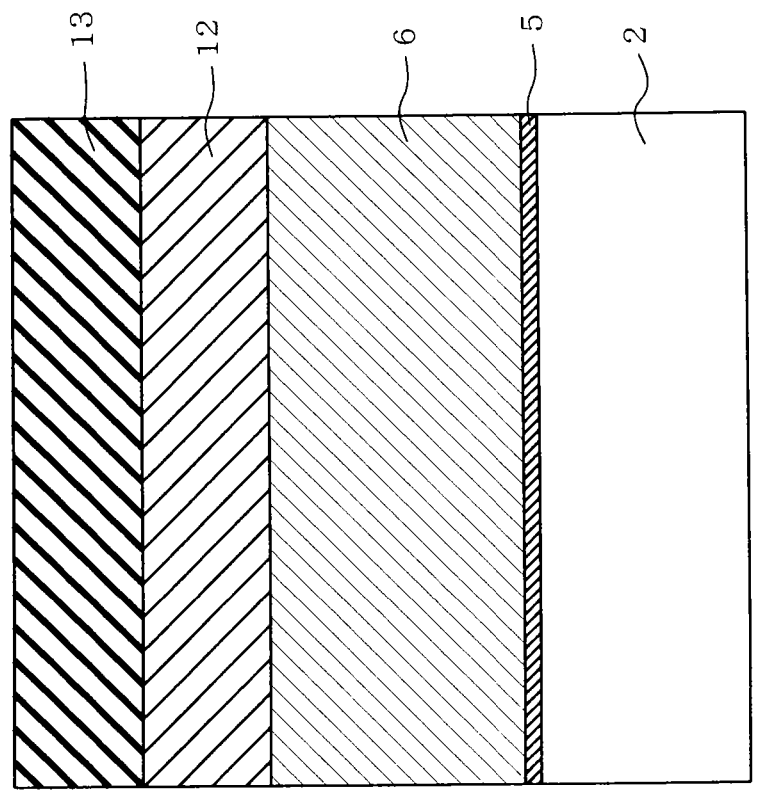
Figure 13A:
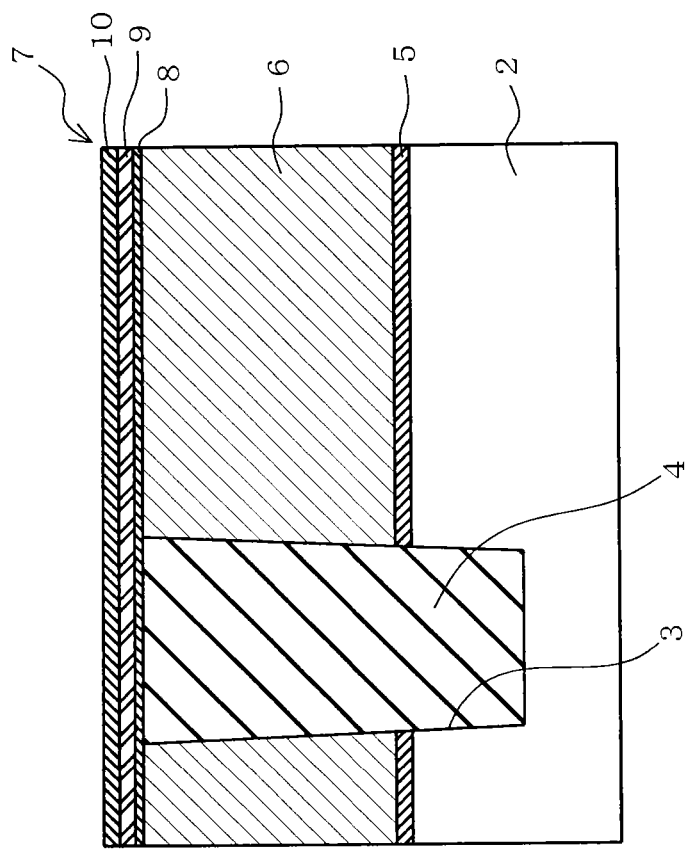
Figure 13B:
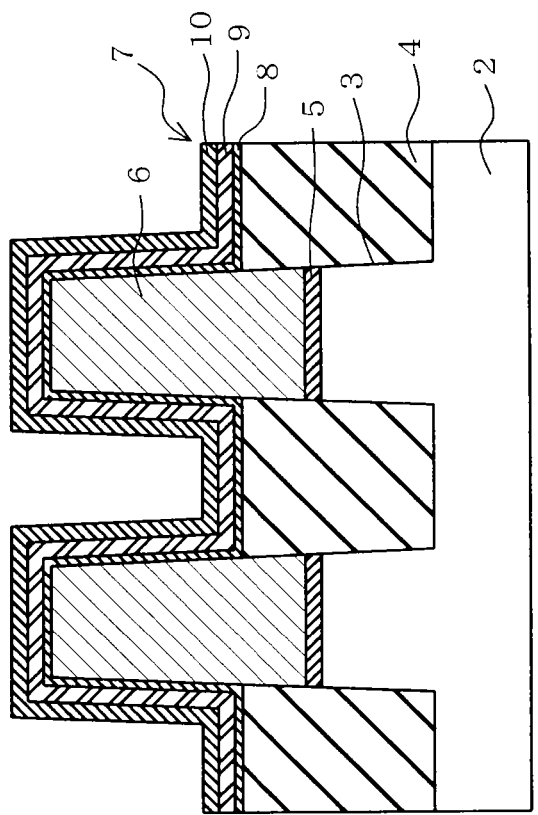

Referring to FIGS. 9A and 9B, approximately 6 nm of gate insulating film 5 is formed above the upper surface of silicon substrate 2 which is doped with impurities. Gate insulating film 5 serves as a tunnel insulating film. Then, above gate insulating film 5, approximately 100 nm of polycrystalline silicon layer 6 doped with phosphorus is formed by CVD (Chemical Vapor Deposition). Polycrystalline silicon layer 6, as described earlier, forms floating gate electrode FG that serves the charge storage layer.

Then, silicon nitride film 12 later used as a mask is formed by CVD which is followed by CVD formation of another mask made of silicon oxide film 13. Silicon oxide film 13 is thereafter coated with a photoresist not shown which is subsequently patterned through exposure and development.

Then, using the patterned photoresist as a mask also referred to as a first resist mask, the underlying silicon oxide film 13 is etched by RIE (Reactive Ion Etching). Photoresist is thereafter removed and silicon oxide film 13 is further used as a mask to etch the underlying silicon nitride film 12 by RIE which is in turn used as a mask to etch polycrystalline silicon layer 6, gate insulating film 5, and silicon substrate 2 to form element isolation trench 3 as can be seen in FIGS. 10A and 10B. According to the first embodiment, the widths of both the active region Sa and element isolation trench 3 are configured at approximately 50 nm.

Then, element isolation trench 3 is overfilled with element isolation insulating film 4 such that element isolation insulating film 4 filling up element isolation trench 3 is further blanketed over silicon oxide film 13. As mentioned earlier, element isolation insulating film 4 comprises a silicon oxide film typically formed by SOG materials such as polysilazane. Then, silicon oxide film 13 is thereafter polished away by CMP (Chemical Mechanical Polishing) using the underlying silicon nitride film 12 as a polish stop to remove the excess element isolation insulating film 4 while leaving element isolation insulating film 4 within element isolation trench 3 as shown in FIG. 11.

Then, silicon nitride film 12 used as an etch mask and a polish stop is removed by wet etching to expose the upper surface of polycrystalline silicon layer 6. Further, the upper portion of element isolation insulating film 4 is removed by wet etching typically using a solution of diluted hydrofluoric acid. As can be seen in FIG. 12A, element isolation insulating film 4 of memory cell region M is etched until approximately 50 nm of the upper sidewall of polycrystalline silicon layer 6 is exposed. Thus, the structure shown in FIG. 12A is obtained in which element isolation trench 3 is filled with element isolation insulating film 4 made of silicon oxide film. Element isolation insulating film 4 in the peripheral circuit region, on the other hand, is not etched down at this stage as can be seen in FIG. 12B.

Next, as shown in FIG. 2, interelectrode insulating film 7 is blanketed above the underlying structure i.e. upper surface 4a of element isolation insulating film 4, and the upper sidewall and the upper surface of polycrystalline silicon layer 6 serving as floating gate electrode FG. The geometries in which interelectrode insulating film 7 is formed in the peripheral circuit region differs from those of memory cell region M in that the elements formed in the peripheral circuit region occupies greater area than the elements formed in memory cell region M. One example of such elements formed in the peripheral circuit region is a capacitor which generates voltage that is applied to the elements in memory cell region M. The structure of the capacitor as well as the formation of interelectrode insulating film 7 will be later described in detail.

Next, approximately 100 nm of conductive layer 11 is formed above interelectrode insulating film 7. Conductive layer 11 according to the first embodiment is a laminate of a polycrystalline silicon film and a tungsten silicide film. Then, silicon nitride film not shown is formed by CVD to serve as a mask in the subsequent RIE. Further above the silicon nitride film, a second resist mask not shown is formed which contains patterns that are oriented orthogonal to the patterns of the first resist mask. Then, using the second resist mask, the silicon nitride mask, conductive layer 11, interelectrode insulating film 7, and polycrystalline silicon layer 6 are etched in the listed sequence. The above series of processes form the stacked gate structure composed of floating gate electrode FG, interelectrode insulating film 7, and control gate electrode CG. The width of each stacked gate structure as well as the spacing between the stacked gate structures are approximately 50 nm.

Then, a spacer film not shown, which is approximately 10 nm thick is formed over the sidewall of the gate structure by thermal oxidation and CVD. Using the spacer film as a mask, impurity diffusion layer not shown serving as the source/drain region is formed by ion implantation and thermal anneal. Thereafter, interlayer insulating film not shown is typically formed by CVD. Then, known techniques are used to form interconnects, etc. not shown.

The end result of the above described process flow provides nonvolatile semiconductor storage device 1 configured by gate insulating film 5 formed above silicon substrate 2, floating gate electrode FG formed above gate insulating film 5, interelectrode insulating film 7 formed above floating gate electrode FG, control gate electrode CG formed above interelectrode insulating film 7, and an impurity diffusion layer formed beside the channel region below the floating gate electrode FG.

One application of nonvolatile semiconductor storage device 1 configured as described above is NAND flash memory in which a plurality of series connected memory cells are disposed between select transistors. Such memory cells are typically erased/programmed by applying high voltage between silicon substrate 2 and control gate electrode CG, whereby electric field intensified in correlation with the coupling ratio is applied on gate insulating film 5 to cause tunnel current to flow through gate insulating film 5. Responsively, amount of stored charge within floating gate electrode FG is varied, causing a shift in the threshold voltage to either program or erase the memory cell. In operation, multiplicity of memory cells is aligned in a matrix along the word lines and the bit lines.

Formation of interelectrode insulating film 7 is discussed in detail hereinafter. After exposing the upper surface and the sidewall of polycrystalline silicon layer 6 as shown in FIG. 12A, interelectrode insulating film 7 is formed by typically stacking silicon oxide film 8, silicon nitride film 9, and silicon oxide film 10 in the listed sequence by LP-CVD (Low Pressure Chemical Vapor Deposition) to obtain an ONO structure.

Then, as shown in FIGS. 14A and 14B, the stack of silicon oxide film 8/silicon nitride film 9/silicon oxide film 10 is anisotropically oxidized. The anisotropic oxidation is controlled such that section 9a of silicon nitride film 9 located above the upper surface of floating gate electrode FG has thickness A1 and section 9b of silicon nitride film 9 located above the sidewall of floating gate electrode FG has thickness A2, where A1<A2. Further section 9c of silicon nitride film 9 located above the upper surface of element isolation insulating film 4 is controlled to thickness A3, where A3≈A1<A2.

Similarly, the anisotropic oxidation is controlled such that section 10a of silicon oxide film 10 located above the upper surface of floating gate electrode FG has thickness B1 and section 10b of silicon oxide film 10 located above the sidewall of floating gate electrode FG has thickness B2, where B1>B2. Further, section 10c of silicon oxide film 10 located above the upper surface of element isolation insulating film 4 is controlled to thickness B3, where B3≈B1>B2.

Advantages of such interelectrode insulating film 7 is discussed hereafter. Because section 10a of silicon oxide film 10 located above the upper surface of floating gate electrode FG is made relatively thick (B1) while section 10b of silicon oxide film 10 located above the sidewall of floating gate electrode FG is made relatively thin (B2), concentration of electric field at the top portion of floating gate electrode FG can be suppressed, thereby reducing leakage current. Reduced leakage current advantageously improves programming speed and program saturation threshold.

The above described configuration addresses increased leakage current typically originating from downscaling. As the gate structures are narrowed by miniaturization, curvature at the top of floating gate electrode FG may be increased into a pointed tip. When subjected to high electric field during programming, electric field concentrates locally around the tip, consequently increasing the leakage current. Even when the top upper surface of floating gate electrode FG is flat, electric field concentrates around the corners and the edges of the top surface.

The first embodiment of the present disclosure addresses this problem by increasing the physical thickness as well as the electric thickness known as EOT (Equivalent Oxide Thickness) of interelectrode insulating film 7 located above the upper surface of floating gate electrode FG while thinning the portion above the sidewall of floating gate electrode FG. Such structure relaxes the local electric field concentration and thus, reduces high electric field leakage current during programming which in turn improves programming speed and program saturation threshold.

In case high field regions such as tips, corners, and edges occupies relatively greater percentage of the top portion of the floating gate electrode FG, it is desirable to make adjustments in EOT of interelectrode insulating film 7 located above the upper surface of floating gate electrode FG. For instance, EOT adjustment can be made through adjustment in the thickness of the silicon oxide film. This is in view of obtaining a balance between coupling ratio control and electric field relaxation. More specifically, increase in EOT of interelectrode insulating film 7 located above the upper surface of floating gate electrode FG reduces the electric capacitance of interelectrode insulating film 7. Reduced electric capacitance of interelectrode insulating film 7 in turn reduces the voltage applied to the gate insulating film 5, i.e. the tunnel insulating film 5 during programming which consequently reduces the coupling ratio. This causes degradation of program properties which may lead to device malfunctioning. Possible approaches for obtaining a desirable coupling ratio may be increasing the area of contact between the sidewall of floating gate electrode FG and interelectrode insulating film 7 or reducing EOT of interelectrode insulating film 7 to increase the electric capacitance of interelectrode insulating film 7. Because the electric field applied to interelectrode insulating film 7 is inversely proportional to EOT of interelectrode insulating film 7, larger EOT above the upper surface of floating gate electrode FG is preferable in terms of relaxing the electric field at the top portion of floating gate electrode FG. However, in view of the above described tradeoff between coupling ratio and electric field, the increase in EOT of interelectrode insulating film 7 is preferably controlled to an amount which is sufficient for relaxing the electric field without negatively affecting the coupling ratio.

Figure 4:
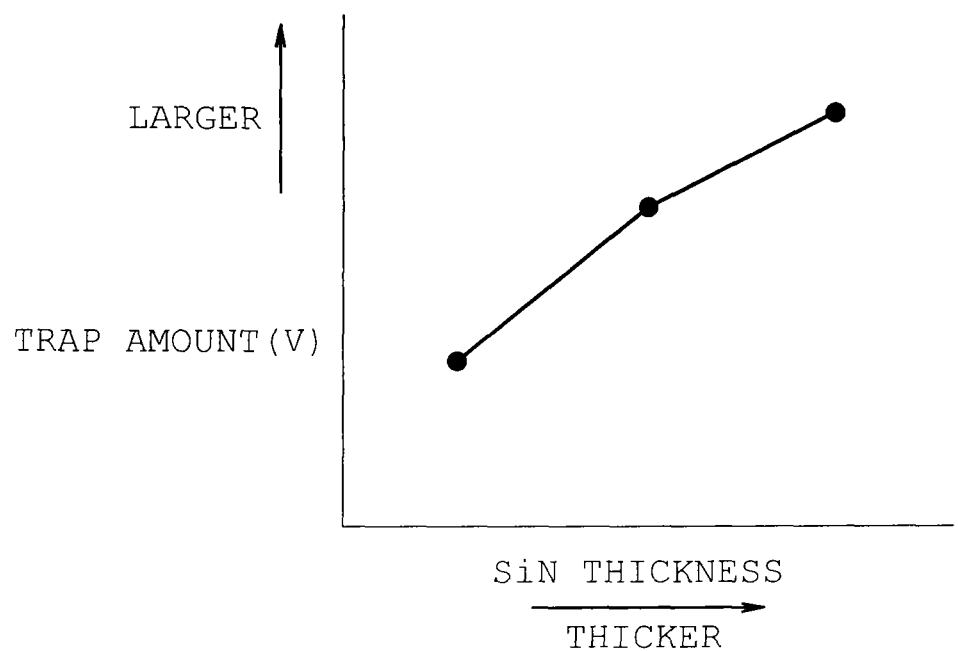
FIG. 4 is a chart plotting the thickness versus the amount of electron traps observed in a silicon nitride film.
Figure 5:
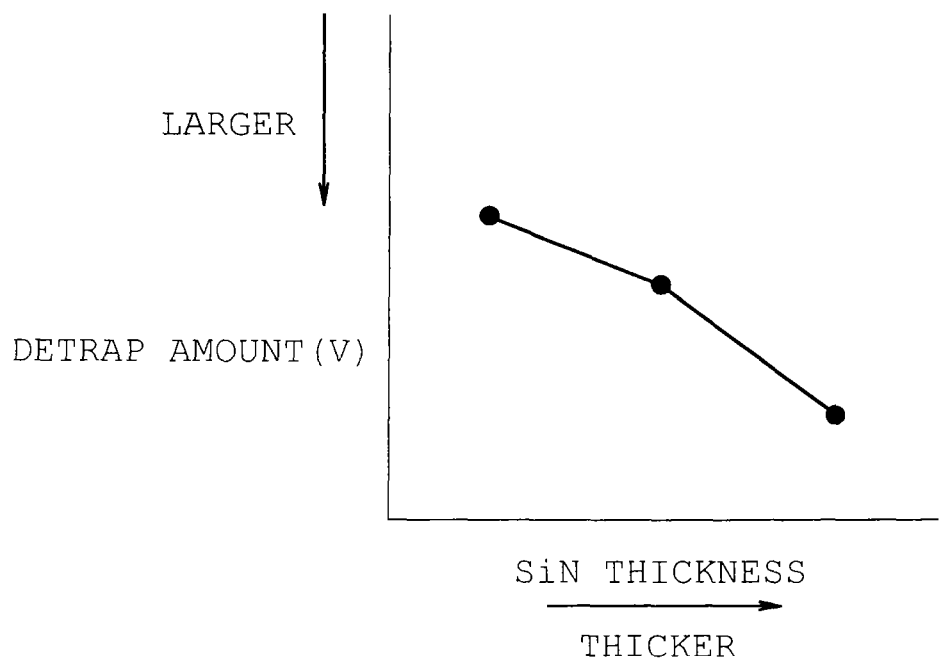
FIG. 5 is a chart plotting the thickness versus the amount electron detraps observed in the silicon nitride film.
Figure 6:
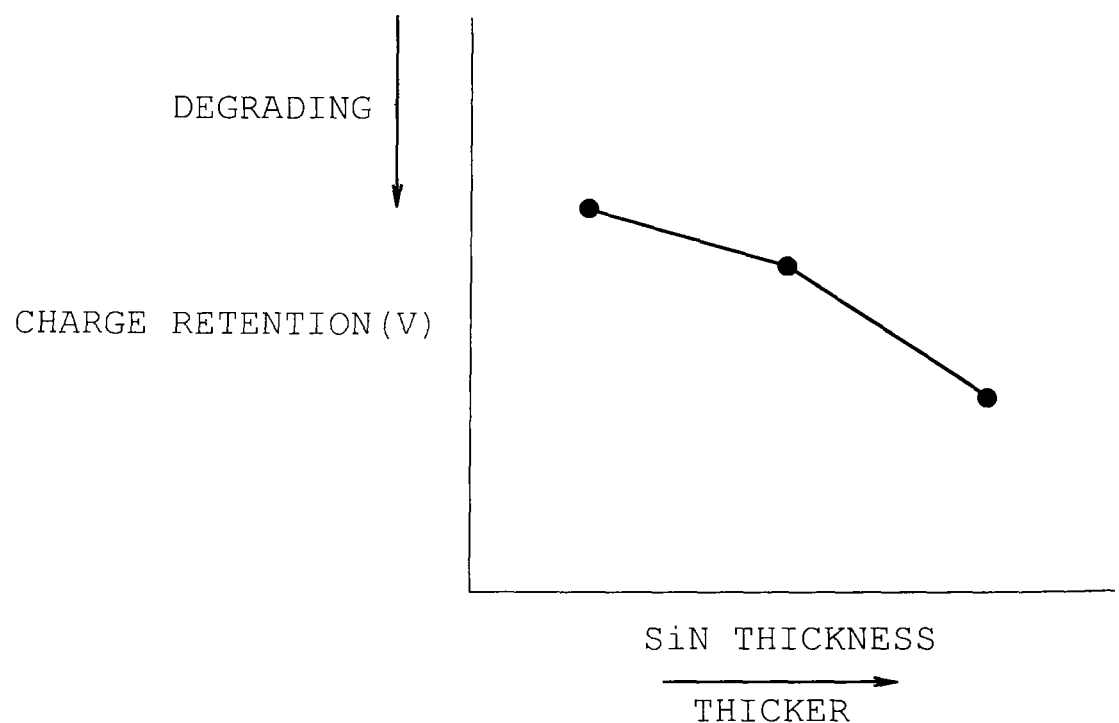
FIG. 6 is a chart plotting the thickness versus the charge retainability of the silicon nitride film.

Further, the ONO structure, in which a silicon nitride film interposes the top and bottom silicon oxide film, traps electrons in the middle silicon nitride film to facilitate electric field relaxation and to reduce high electric field leakage current during programming. However, the amount of electron trapping increases with the thickness of silicon nitride film as indicated in FIG. 4 and the increase in the amount of electron trapping unwantedly increases the amount of electron detrapping when the device is turned off as can be seen in FIG. 5. Thus, increasing the thickness of silicon nitride film may result in the degradation of charge retainability as can be seen in FIG. 6. Because the amount of electron trapping increases with the current traffic through the interelectrode insulating film, most of electron trapping occurs through the top portion of floating gate electrode FG.

Given the above, interelectrode insulating film 7 of the first embodiment is configured such that silicon nitride film 9 is made relatively thinner at the portion above the top of the floating gate electrode FG where relatively large amount of current flow is observed by electric field concentration during programming, whereas silicon oxide film 10 is made thicker in the same location. Thus, EOT of interelectrode insulating film 7 is increased at the top portion of floating gate electrode FG to relax the electric field while suppressing the leakage current during programming. Because the thick silicon oxide film 10 above the upper surface of floating gate electrode FG suffices to relax the electric field, silicon nitride film 9 in this location is thinned to prevent increase in the amount of electron trapping.

Figure 7:
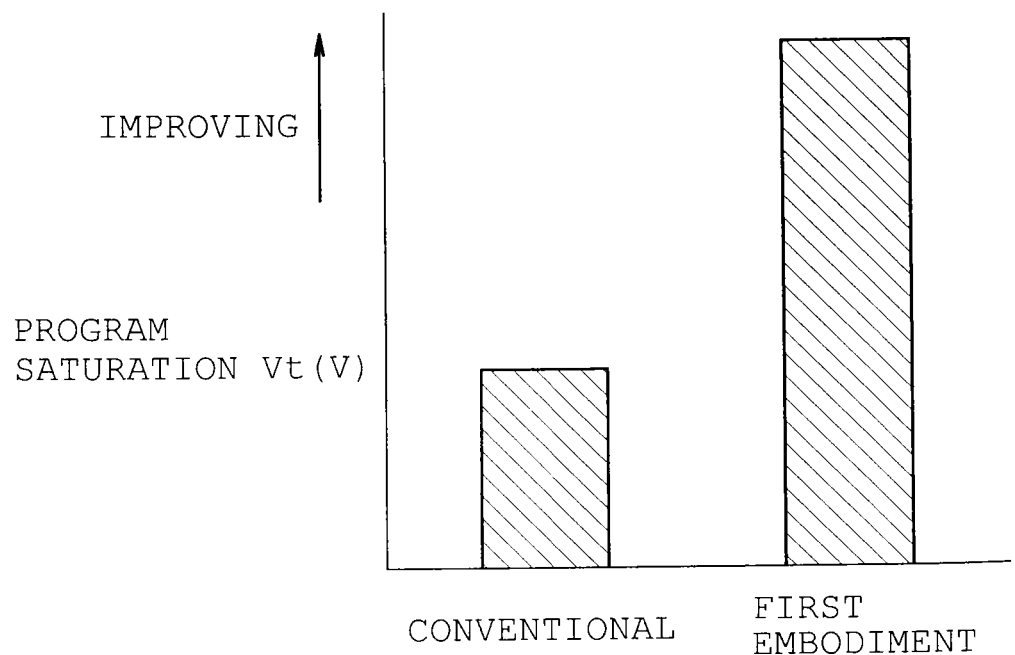
FIG. 7 is a chart providing a comparative evaluation of the first embodiment and the conventional configurations in terms of program saturation.
Figure 8:
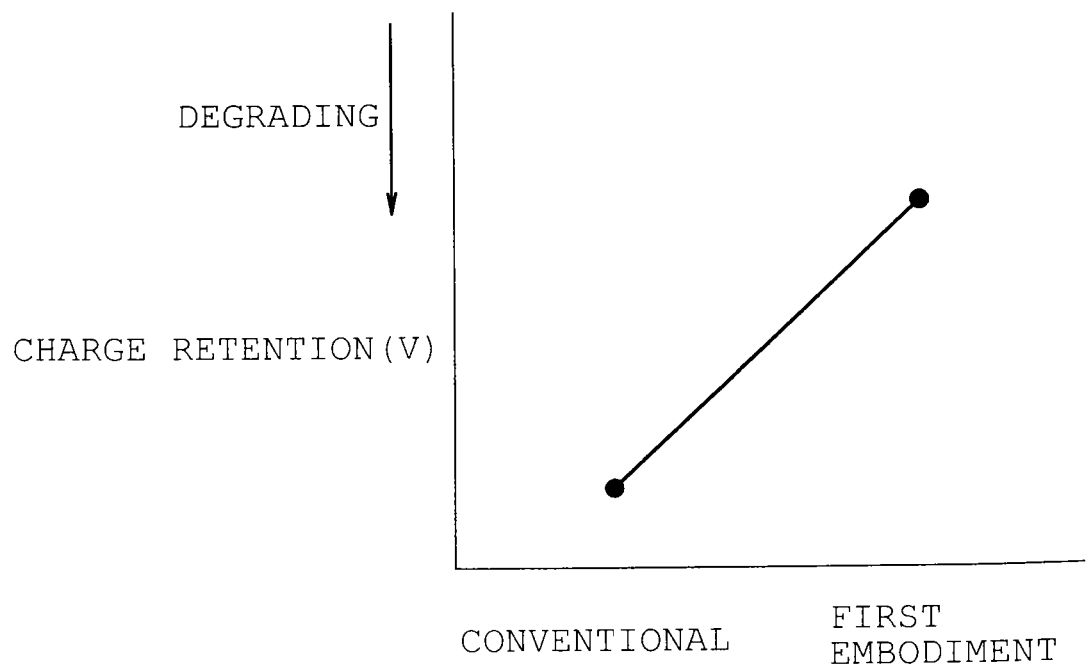
FIG. 8 is a chart providing a comparative evaluation of the first embodiment and the conventional configurations in terms of charge retainability.

FIGS. 7 and 8 are charts comparing the measurements of the program saturation characteristics and charge storing characteristics of the nonvolatile semiconductor storage device 1 according to the first embodiment against those of the conventional structures. The conventional structures in this context indicate structures similar to the structure of FIG. 13 which is yet to be anisotropically oxidized. As evidenced in FIGS. 7 and 8, by forming a thick silicon oxide film 10 and a thin silicon nitride film 9 above the upper surface of floating gate electrode FG, amount of current flow through interelectrode insulating film 7 is reduced which in turn reduces the amount of trapping and detrapping of electrodes to thereby improve the charge retainability of each memory cell.

Electron traps are not only observed in silicon nitride film 9 in the middle layer of the ONO stack located above the upper surface of floating gate electrode FG but also in silicon nitride film 9 of the ONO stack located above the upper surface 4a of element isolation insulating film 4 located between the neighboring floating gate electrodes FG.

However, because silicon nitride film 9 located between the neighboring floating gate electrodes FG is thinned, the amount of electron trapping can be relatively reduced to prevent malfunctioning of neighboring memory cells.

According to the first embodiment, memory cell region M is configured such that EOT of interelectrode insulating film 7 located above the sidewall of floating gate electrode FG is made relatively thinner than the EOT of interelectrode insulating film 7 located above the upper surface of floating gate electrode FG. Such configuration substantially reduces EOT of interelectrode insulating film 7 in memory cell region M while obtaining a thick EOT for interelectrode insulating film 7 in the peripheral circuit region as can be seen in FIGS. 14A and 14B.

More specifically, memory cell region M typically having a pillar shaped gate electrode structure is configured such that as opposed to the relative thickness of silicon nitride film 9 to silicon oxide film 10 that are located above the upper surface of floating gate FG, relative thickness of silicon nitride film 9 located above the sidewall of floating gate electrode FG is greater than silicon oxide film 10 located above the sidewall of floating gate electrode FG and above silicon nitride film 9. Thus, EOT of interelectrode insulating film 7 located above the sidewall of floating gate electrode FG is made relatively thinner as compared to EOT of interelectrode insulating film 7 located above the upper surface of floating gate electrode FG.

In contrast, in the peripheral circuit region, and more particularly in the peripheral capacitor region where the capacitors are formed, EOT of interelectrode insulating film 7 located above the upper surface of floating gate electrode FG primarily influences the properties in question. This is because the capacitor primarily utilizes the planner upper surface of floating gate electrode FG as a contributing source of its capacitance. Thus, in the peripheral capacitor region where the top portion of floating gate electrode FG has greater surface area and possibly greater area of high field regions as compared to memory cell region M, interelectrode insulating film 7 is formed with thick EOT. Hence, the first embodiment allows the desired coupling ratio to be obtained in memory cell region M while improving the endurance of the capacitor in the peripheral circuit region.

Figure 15:
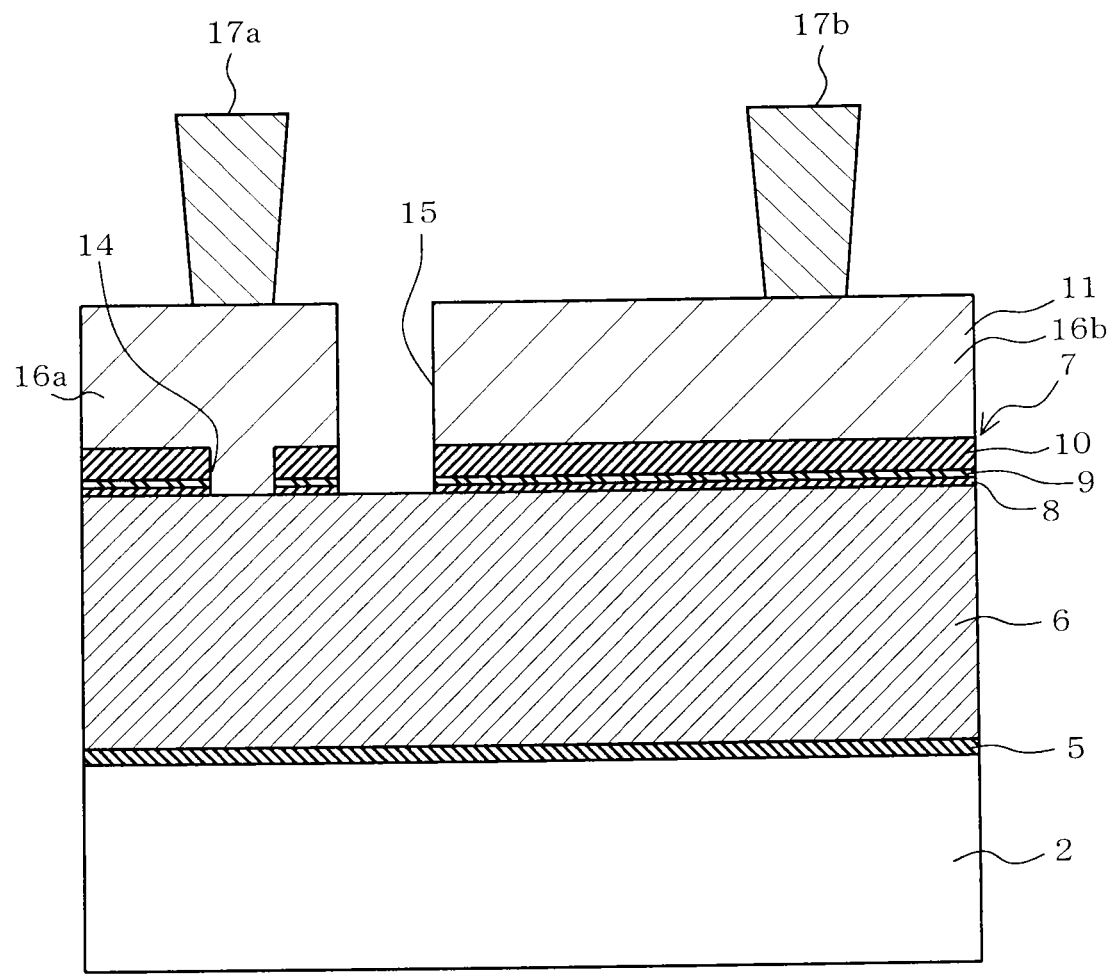
FIG. 15 is a cross section of a capacitor formed in the peripheral circuit region.

FIG. 15 exemplifies a capacitor formed in the peripheral circuit region according to the first embodiment. As shown in FIG. 15, interelectrode insulating film 7 is formed above polycrystalline silicon layer 6 of both memory cell region M and the peripheral circuit region. Then opening 14 is formed through interelectrode insulating film 7 of the peripheral circuit region by photolithography and etching to expose polycrystalline silicon layer 6. Opening 14 may be formed when forming an opening not shown through interelectrode insulating film 7 of the select transistors of memory cell region M for interconnecting polycrystalline silicon layer 6 and conductive layer 11.

Then, after forming conductive layer 11 above interelectrode insulating film 7, gaps 15 are formed into conductive layer 11 and interelectrode insulating film 7 by lithography and etching to separate conductive layer 11 into lines of capacitor electrodes 16a and capacitor electrodes 16b. Each of capacitor electrodes 16a is connected to polycrystalline silicon layer 6 through opening 14, whereas each of capacitor electrodes 16b is insulated from polycrystalline silicon layer 6 by interelectrode insulating film 7 interposed therebetween.

Thereafter, contact electrode 17a is formed above capacitor 16a and contact electrode 17b is formed above capacitor electrode 16b. Contact electrodes 17a and 17b establish contact with the corresponding capacitor electrodes 16a and 16b as can be seen in FIG. 15.

Capacitors of the peripheral circuit region are thus, formed such that each has a capacitor insulating film made of interelectrode insulating film 7 which has large EOT and consequently longer endurance or longevity compared to conventional capacitors.

Next, oxidation of interelectrode insulating film 7 will be further detailed focusing on the oxidation of silicon nitride film 9 in the middle of the stack to obtain the top silicon oxide film 10.

Generally, thickness of a silicon oxide film formed by oxidation of a silicon nitride film varies depending upon the density of the source silicon nitride film. For instance, an ideal silicon nitride film having a density of 2.6 g/cm$^2$ and a thickness of 1 nm, when oxidized, produces a layer of silicon oxide film having a density of 2.2 g/cm$^2$ and a thickness of 1.5 nm. However, at some densities of the source silicon nitride film, typically a silicon nitride film having low density, the resulting silicon oxide film may not add any thickness to the source silicon nitride film. This means that thickness of the post-oxidation silicon nitride film and the resulting silicon oxide film taken together may be equal to the thickness of the pre-oxidation silicon nitride film. In such case, because the thickness remains unchanged after oxidation, relative content of SiO to SiN is increased, meaning that silicon oxide film having relatively less dielectric constant occupies relatively greater percentage of interelectrode insulating film 7, which in turn increases the EOT of interelectrode insulating film 7.

The silicon nitride film being subjected to the oxidation is preferably formed by deposition such as LP-CVD and ALD (Atomic Layer Deposition). The Si source in such case may be inorganic materials such as disilane, DCS (Dichlorosilane, $SiH_2Cl_2$), or HCD (Hexa Chloro Dislane, $Si_2Cl_6$) or organic materials comprising a bond of Si and amino group. The N source may be $NH_3$ or radical nitrogen, etc.

Next a description will be given in detail on the anisotropic oxidation of silicon nitride film 9 of inter electrode layer 7 which was briefly discussed earlier. According to the first embodiment, the anisotropic oxidation involves generating plasma using microwaves in an ambient containing oxygen gas to produce oxygen radicals and oxygen ions which are used to form silicon oxide film from silicon nitride film 9. The parameters of the oxidation include microwave intensity ranging between 500 to 5000 W, substrate bias ranging between 0.1 to 2000 mW/cm$^2$ for drawing oxygen ions toward the silicon substrate, pressure ranging between 10 to 800 Pa, and silicon substrate temperature ranging between room temperature to 800 degrees Celsius. For improved film formation rate, anisotropic oxidation may be performed by using oxidizing agent which is generated by reacting hydrogen gas with oxygen gas. In such case, the flow rate of hydrogen gas within the mixture of oxygen gas and hydrogen gas may range between 0.01 to 30%. Yet, alternatively, anisotropic oxidation with the above described parameter settings may be performed by generating plasma through interaction of the magnetic field of a permanent magnet and high frequency electric field applied to RF (Radio Frequency) electrode.

The ONO stack of oxide film 8/silicon nitride film 9/silicon oxide film 10 employed in interelectrode insulating film 7 of the first embodiment may be replaced by NONO stack, ONON stack or NONON stack as long as it contains an ONO structure. To achieve across wafer uniformity, ALD may be employed in forming the stack of silicon oxide film and silicon nitride film.

According to the first embodiment, silicon nitride film 9 of interelectrode insulating film 7 was anisotropically oxidized through the top silicon oxide film 10 after forming the stack of silicon oxide film 8, silicon nitride film 9, and silicon oxide film 10. Alternatively, silicon nitride film 9 may be anisotropically oxidized after stacking the bottom silicon oxide film 8 and the middle silicon nitride film 9 whereafter the top silicon oxide film 10 is formed. When ONON structure is employed, anisotropic oxidation is preferably performed when the stack is in the ONO stage or ON stage. Likewise, when NONON structure is employed, anisotropic oxidation is preferably performed when the stack is in the NONO stage or the NON stage.

Still further, instead of anisotropic oxidation, plasma oxidation using oxygen gas may be employed to oxidize silicon nitride film 9 of interelectrode insulating film 7. The plasma oxidation allows selective oxidation of silicon nitride film 9 above the upper surface of floating gate electrode FG without having to apply bias for drawing the oxygen ions toward the substrate. The plasma oxidation is preferably performed under low pressure ranging between 10 to 300 Pa. The selective oxidation allows the silicon oxide formed above the upper surface of floating gate electrode FG to be formed thicker than above the sidewall of floating gate electrode FG, as well as allowing silicon nitride film 9 to be formed relatively thinner above the upper surface of floating gate electrode FG than above the sidewall of floating gate electrode FG. The above described structure relaxes the programming electric field, which in turn reduces the high electric field leakage current, thereby improving device properties.

The amount of oxidation of silicon nitride film 9 may be controlled as required through adjustment of oxidation parameters. Any type of anisotropic oxidation may be employed other than radical oxidation to obtain the same advantages as long as the oxidation proceeds anisotropically. The foregoing oxidation schemes may be carried out more than once as long as the total amount of oxidation is properly controlled to obtain the desired EOT.

As the result of anisotropic oxidation described in the first embodiment, section 9a of silicon nitride film 9 located above the upper surface of floating gate electrode FG has thickness A1 which is thinner than thickness A2 of section 9b of silicon nitride film 9 located above the sidewall of floating gate electrode FG. Alternatively, section 9a may be dissipated by anisotropic oxidation.

Further, section 9c of silicon nitride film 9 located above the upper surface of element isolation insulating film 4 is controlled to thickness A3 which is thinner than section 9b of silicon nitride film 9 located above the sidewall of floating gate electrode FG. Alternatively, section 9c may be dissipated by anisotropic oxidation.

Thus, according to the first embodiment, nonvolatile semiconductor storage device 1 is configured by interelectrode insulating film 7 including an ONO structure with improved insulativity. The improved insulativity is achieved by anisotropically oxidizing the middle silicon nitride film 9, whereby EOT of the interelectrode insulating film 7 is made relatively thicker above the upper surface of floating gate electrode FG and relatively thinner above the sidewall of floating gate electrode FG.

Figure 16:
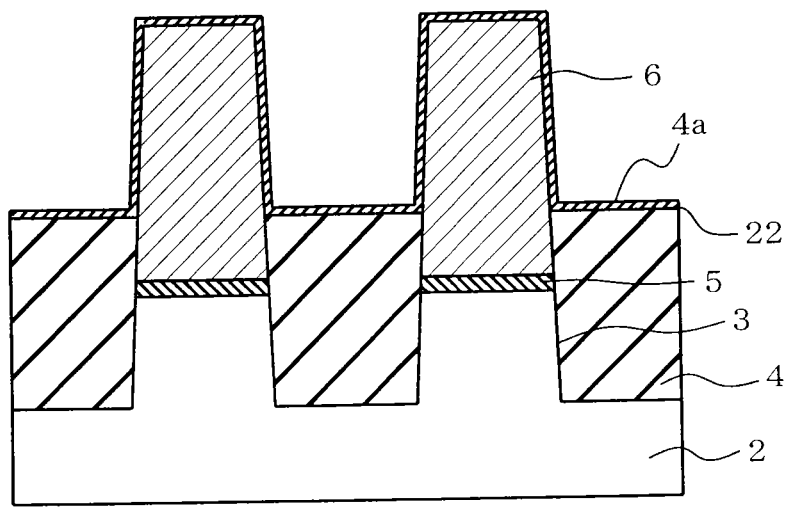
FIGS. 16 to 18 each depict a cross section taken along line 2-2 of FIG. 1 illustrating one phase of a manufacturing process flow of the memory cell region according to a second embodiment of the present disclosure.
Figure 17:
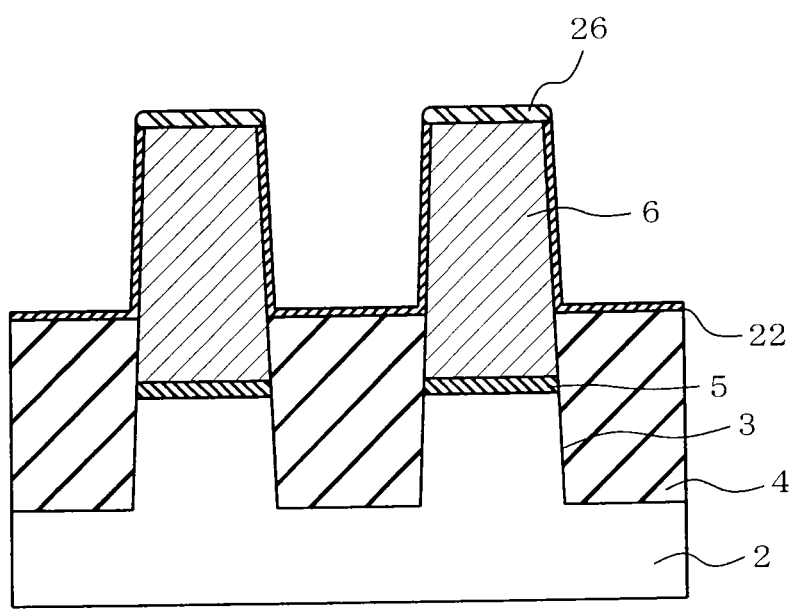
Figure 18:
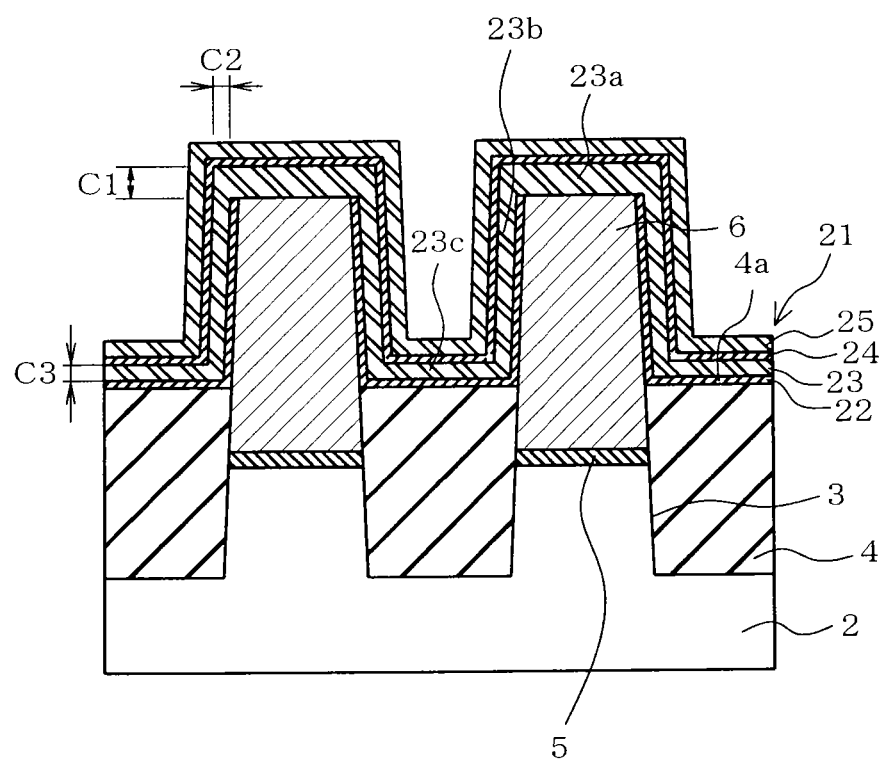

FIGS. 16 to 18 illustrate a second embodiment of the present disclosure. Elements that are similar or identical to the first embodiment are identified with similar or identical reference symbols. Second embodiment differs from the first embodiment in that interelectrode insulating film 7 is replaced by interelectrode insulating film 21 configured as shown in FIG. 18. Interelectrode insulating film 21 is configured by silicon nitride film 22 formed above upper surface 4a of element isolation insulating film 4 and above the sidewall of floating gate electrode FG, silicon oxide film 23 formed above silicon nitride film 22 and above the upper surface of floating gate electrode FG, silicon nitride film 24 formed above silicon oxide film 23, and silicon oxide film 25 formed above silicon nitride film 24.

Silicon nitride film 22 at the lowermost layer of the stacked interelectrode insulating film 22 is formed above upper surface 4a of element isolation insulating film 4 and above the sidewall of floating gate electrode FG but not above the upper surface of floating gate electrode FG. Further, the thickness of section 23a of silicon oxide film 23 located above the upper surface of floating gate electrode FG has measurement C1, whereas the thickness of section 23b located above the sidewall of floating gate electrode FG has measurement C2, where C1>C2. Further, the thickness of section 23c located above the upper surface of element isolation insulating film 4 has measurement C3, where C3≈C2.

The method of forming interelectrode insulating film 21 will be described in detail hereafter. The process flow illustrated in FIGS. 9A to 12B of the first embodiment are repeated to expose the upper surface and the sidewall of polycrystalline silicon layer 6 which serves as floating gate electrode FG. Then, as shown in FIG. 16, silicon nitride film 22 is formed above upper surface 4a of element isolation insulating film 4, sidewall of floating gate electrode FG, and upper surface of floating gate electrode FG by radical nitridation, for example.

Then, silicon nitride film 22 above the upper surface of floating gate electrode FG is dissipated by local oxidation as shown in FIG. 17 to obtain silicon oxide film 26. Local oxidation will be later described in detail.

Thereafter, a stack of silicon oxide film 23/silicon nitride film 24/silicon oxide film 25 are formed by LP-CVD to obtain interelectrode insulating film 21 shown in FIG. 18. As can be seen in FIG. 18, silicon oxide film 26 above the top upper surface of floating gate electrode FG is incorporated into silicon oxide film 23. The subsequent process flow for obtaining nonvolatile semiconductor storage device 1 are identical to those described in the first embodiment.

Local oxidization will be discussed in detail hereafter. According to the second embodiment, local oxidation is carried out through plasma oxidation under low pressure using oxygen gas. The parameters of the oxidation include microwave intensity ranging between 500 to 5000 W, low pressure ranging between 10 to 300 Pa, and silicon substrate temperature ranging between room temperature to 800 degrees Celsius. Oxygen radicals and oxygen ions are produced by generating plasma using microwaves in an ambient containing oxygen gas. Such low presser plasma oxidation is employed to dissipate silicon nitride film 22 above the top upper surface of floating gate electrode FG and to form silicon oxide film 26.

Another approach for local oxidation may be anisotropic oxidation which also generates plasma using microwaves in an ambient containing oxygen gas to produce oxygen radicals and oxygen ions. The parameters of the oxidation include microwave intensity ranging between 500 to 5000 W, substrate bias ranging between 0.1 to 2000 $mW/cm^2$ for drawing oxygen ions toward the silicon substrate, pressure ranging between 10 to 800 Pa, and silicon substrate temperature ranging between room temperature to 800 degrees Celsius. The above described anisotropic oxidation is used to dissipate silicon nitride film 22 above the top upper surface of floating gate electrode FG and to form silicon oxide film 26.

To improve film formation rate in the above approaches, anisotropic oxidation may be performed by using oxidizing agent which is generated by reacting hydrogen gas with oxygen gas. In such case, the flow rate of hydrogen gas within the mixture of oxygen gas and hydrogen gas may range between 0.01 to 30%. Yet, alternatively, anisotropic oxidation with the above described parameter settings may be performed by generating plasma through interaction of the magnetic field of a permanent magnet and high frequency electric field applied to RF (Radio Frequency) electrode.

The amount of local oxidation of the top upper surface of floating gate electrode FG may be controlled through adjustment of oxidation parameters in each of the above described oxidation schemes.

According to the second embodiment, silicon nitride film 22 is formed above element isolation insulating film 4 and floating gate electrode FG by radical nitridation. Radical nitridation generates plasma using microwaves in an ambient containing nitridation gas to produce nitrogen radicals and nitrogen ions.

Silicon nitride film 22 may be formed by other methods such as LP-CVD and ALD. The Si source in such case may be inorganic materials such as disilane, DCS, or HCD or organic materials comprising a bond of Si and amino group. The N source may be $NH_3$ or radical nitrogen, etc.

According to the second embodiment, silicon nitride film 22 at the lowermost layer of the stacked interelectrode insulating film 21 is formed above upper surface 4a of element isolation insulating film 4 and above the sidewall of floating gate electrode FG but not above the upper surface of floating gate electrode FG. Further, thickness C1 of section 23a of silicon oxide film 23 located above the upper surface of floating gate electrode FG is made thicker than thickness C2 of section 23b located above the sidewall of floating gate electrode FG. The above described structure reduces leakage current originating from electric field concentration at the high-field regions such as the tips, corners, and edges in the top portion of floating gate electrode FG, which in turn improves programming speed and program saturation threshold. Further, the above described structure prevents increase of electron traps in the silicon nitride film of interelectrode insulating film 21 located above the top portion of floating gate electrode FG.

An interelectrode insulating film may be exemplified which is similar in structure to interelectrode insulating film 21 in which: silicon oxide film is formed above the upper surface of the floating gate electrode FG, followed by formation of a silicon nitride film above the sidewall of the floating gate electrode FG and the silicon oxide film, and further followed by formation of a silicon oxide film above the silicon nitride film. As a result, the silicon nitride film which interposes the top and bottom silicon oxide film above the upper surface of floating gate electrode FG is placed in direct physical contact with the sidewall of floating gate electrode FG. Such structure causes increased electron traps in the silicon nitride film located above the upper surface of floating gate electrode and may further introduce the following problem when applied in a restrictive operation where elevation of threshold voltage is not permitted after programming.

During programming, the silicon nitride film interposing the top and bottom silicon oxide film traps electrons which diffuse through the silicon nitride film to be injected into floating gate electrode FG, thereby causing elevation in programming threshold. The elevation in the threshold voltage may be attributable to increasing number of electrons being drawn closer to the silicon substrate or the bit line relative to the control gate CG as the program operation progresses.

In the second embodiment, silicon nitride film 22 is formed directly in physical contact with the sidewall portion of floating gate electrode FG. If the design of the device does not permit the side effects of the direct formation such as increase in fixed charge and increase in the interface energy level, 1 nm or thinner silicon oxide film may be formed above floating gate electrode FG for adjustment of interface properties and silicon nitride film 22 may be formed above the silicon oxide film. Such structure also provides advantages similar to those of the second embodiment.

Further according to the second embodiment, silicon nitride film 22 is formed above upper surface 4a of element isolation insulating film 4. Alternatively, silicon nitride film 22 above upper surface 4a of element isolation insulating film 4 may be dissipated by oxidation to form a silicon oxide film. The dissipation is preferably carried out when silicon nitride film 22 is dissipated from the top upper surface of floating gate electrode FG.

Still further according to the second embodiment, NONO stack of silicon nitride film 22, silicon oxide film 23, silicon nitride film 24, and silicon oxide film 25 is employed as interelectrode insulating film 21. A top silicon nitride layer may be added to obtain a NONON stack. Still further, the ONO structure in which a silicon nitride film interposes upper silicon oxide and lower silicon oxide may be replaced by a stack of a high dielectric constant film and a silicon oxide film.

Yet, further according to the second embodiment, radical oxidation is employed for performing local oxidation. Any other oxidation schemes may be employed as along as local oxidation can be pursued.

Finally, according to the second embodiment, silicon nitride film 22 is formed above upper surface 4a of element isolation insulating film 4, the upper sidewall of floating gate electrode FG, and the top upper surface of floating gate electrode FG, whereafter silicon nitride film 22 located above the top upper surface of floating gate electrode FG is locally oxidized. Alternatively, silicon oxide film 23 may be formed above silicon nitride film 22 and silicon nitride film 22 may be locally oxidized through silicon oxide film 23. Further, local oxidation can be performed any number of times as long as appropriate amount of oxidation can be obtained to form interelectrode insulating film 21 of desired EOT within memory cell region M.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
  a semiconductor substrate;
  an element isolation region that is defined in the semiconductor substrate and that has an element isolation insulating film formed therein;
  an active region defined in the semiconductor substrate which is delineated by the element isolation region;
  a gate insulating film formed in the active region;

a charge storage layer formed above the gate insulating film;

a multilayered interelectrode insulating film formed in a first region above an upper surface portion of the element isolation insulating film, a second region above a sidewall portion of the charge storage layer, and a third region above an upper surface portion of the charge storage layer, the interelectrode insulating film including a stack of an upper silicon oxide film, a middle silicon nitride film, and a lower silicon oxide film; and a control gate electrode formed above the interelectrode insulating film;

wherein the middle silicon nitride film is thinner in the third region than in the second region and the upper silicon oxide film is thicker in the third region than in the second region.

2. The device according to claim 1, wherein the middle silicon nitride film is thinner in the first region than in the second region and the upper silicon oxide film is thicker in the first region than in the second region.

3. The device according to claim 1, wherein the semiconductor substrate includes a memory cell region and a peripheral circuit region and the control gate electrode in the peripheral circuit region is segmented to form a first and a second capacitor electrode above the interelectrode insulating film, the first capacitor electrode being connected to the charge storage layer through an opening defined through the interelectrode insulating film.

4. The device according to claim 1, wherein the interelectrode insulating film consists of a silicon oxide film, a silicon nitride film, and a silicon oxide film stacked in the listed sequence.

5. The device according to claim 1, wherein the interelectrode insulating film includes a silicon nitride film, a silicon oxide film, a silicon nitride film, and a silicon oxide film stacked in the listed sequence.

6. The device according to claim 1, wherein the interelectrode insulating film includes a silicon oxide film, a silicon nitride film, a silicon oxide film, and a silicon nitride film stacked in the listed sequences.

7. The device according to claim 1, wherein the interelectrode insulating film includes a silicon nitride film, a silicon oxide film, a silicon nitride film, a silicon oxide film, and a silicon nitride film stacked in the listed sequence.

8. The device according to claim 1, wherein the middle silicon nitride film in the third region is dissipated.

9. The device according to claim 2, wherein the middle silicon nitride film in the first region is dissipated.

10. A semiconductor device comprising:
a semiconductor substrate,
an element isolation region that is defined in the semiconductor substrate and that has an element isolation insulating film formed therein;
an active region defined in the semiconductor substrate which is delineated by the element isolation region;
a gate insulating film formed in the active region;
a charge storage layer formed above the gate insulating film;
a multilayered interelectrode insulating film formed in a first region above an upper surface portion of the element isolation insulating film, a second region above a sidewall portion of the charge storage layer and a third region above an upper surface portion of the charge storage layer; and
a control gate electrode formed above the interelectrode insulating film;
wherein the interelectrode insulating film includes a stack of a first silicon nitride film formed in the second region but not in the third region, and a first silicon oxide film formed above the first silicon nitride film and in the third region, and wherein the first silicon oxide film formed above the third region is thicker than the first silicon oxide film formed above the first silicon nitride film.

11. The device according to claim 10, wherein the first silicon nitride film is formed above the second region and not in the first and the third region.

12. The device according to claim 10, wherein 1 nm or thinner silicon oxide film is formed in the second region between the sidewall of the charge storage layer and the first silicon nitride film.

13. The device according to claim 10, wherein the interelectrode insulating film further includes a stack of a second silicon nitride film and a second silicon oxide film above the first silicon oxide film.

14. The device according to claim 10, wherein the interelectrode insulating film further includes a stack of a second silicon nitride film, a second silicon oxide film, and a third silicon nitride film above the first silicon oxide film.

* * * * *